(12) United States Patent
Van Sinderen et al.

(10) Patent No.: US 8,818,308 B2
(45) Date of Patent: Aug. 26, 2014

(54) MULTI-TUNER APPARATUS FOR RECEIVING RF SIGNALS

(75) Inventors: Jan Van Sinderen, Liempde (NL); Francois Seneschal, Caen (FR); Jacques Potier, Bieville-Beuville (FR)

(73) Assignee: NXP, B.V., Eindhoven (NL)

( * ) Notice: Subject to any disclaimer, the term of this patent is extended or adjusted under 35 U.S.C. 154(b) by 1404 days.

(21) Appl. No.: 12/063,857

(22) PCT Filed: Aug. 15, 2006

(86) PCT No.: PCT/IB2006/052811
§ 371 (c)(1),
(2), (4) Date: Dec. 5, 2008

(87) PCT Pub. No.: WO2007/023417
PCT Pub. Date: Mar. 1, 2007

(65) Prior Publication Data
US 2009/0219449 A1 Sep. 3, 2009

(30) Foreign Application Priority Data
Aug. 22, 2005 (EP) ..................................... 05300684

(51) Int. Cl.
*H04B 1/18* (2006.01)
(52) U.S. Cl.
USPC ............... 455/188.1; 455/142; 455/193.1; 455/273
(58) Field of Classification Search
CPC ............... H03J 1/0083; H04H 40/18
USPC .................................................. 455/188.1
See application file for complete search history.

(56) References Cited

U.S. PATENT DOCUMENTS

| | | | | |
|---|---|---|---|---|
| 6,414,549 B1 * | 7/2002 | Barbetta | ...................... | 330/264 |
| 6,456,832 B1 * | 9/2002 | Yanagisawa et al. | ....... | 455/193.1 |
| 6,483,554 B1 * | 11/2002 | Kim | ................ | 348/731 |
| 6,567,653 B1 * | 5/2003 | Sanders | ....................... | 455/126 |
| 6,760,079 B2 * | 7/2004 | Morisada | ....................... | 348/731 |
| 6,937,101 B2 * | 8/2005 | Hageman et al. | ............. | 330/285 |
| 7,142,060 B1 * | 11/2006 | Maeda | ........................ | 330/295 |
| 7,292,830 B1 * | 11/2007 | Cheung et al. | ................ | 455/136 |
| 2003/0035070 A1 | 2/2003 | Fanous et al. | | |
| 2003/0128302 A1 | 7/2003 | Potrebic et al. | | |
| 2004/0116097 A1 * | 6/2004 | Shen | ............................ | 455/323 |
| 2005/0253663 A1 | 11/2005 | Gomez et al. | | |
| 2006/0128328 A1 * | 6/2006 | Shah | ......................... | 455/178.1 |
| 2006/0164133 A1 * | 7/2006 | Fukui et al. | .................... | 327/108 |
| 2007/0188214 A1 * | 8/2007 | Koyama et al. | ............... | 327/330 |

FOREIGN PATENT DOCUMENTS

WO 2006065647 A2 6/2006

OTHER PUBLICATIONS

Van Sinderen, Jan; et al "A 48-860 MHZ TV Splitter Amplifier Exhibiting an IIP2 and IIP3 of 94DBMV and 73DBMV" European Solid-States Circuits Conference, 2004 (ESSCIRC 2004), pp. 195-198.

* cited by examiner

Primary Examiner — Ajibola Akinyemi

(57) ABSTRACT

A multi-tuner apparatus comprises a splitter (S) for received RF signals. The splitter has a splitter output (U) for connection to a plurality of tuners. To reduce signal degradation and dissipation the output impedance of the splitter output is substantially lower than the input impedance of each of the tuners.

16 Claims, 4 Drawing Sheets

MULTI-TUNER APPARATUS FOR RECEIVING RF SIGNALS

The invention relates to a multi-tuner apparatus comprising an active splitter with an input for connection to an RF signal source.

A multi-tuner apparatus is known from the article: "A 48-860 Mhz splitter amplifier exhibiting an IIP2 and IIP3 of 94 dBmV and 73 dBmV." by Jan van Sinderen et al.; European Solid-States Circuits Conference, 2004 (ESSCIRC 2004), pages 195-198.

Nowadays applications with multiple tuners for simultaneously receiving different channels are used more and more. Such apparatus are for instance TV-receivers with split-screen and/or picture-in-picture feature, VCRs with recording and monitoring function, DVD-recorders with the ability to store one channel and to simultaneously view another channel, and Personal Computers with the ability to view one channel, to store a second channel on an optical DVD-disk and to store a third channel on a magnetic hard disk. It is noted that the invention is not restricted to receivers of television signals but may also be used in multi-tuner receivers of radio signals.

The plurality of tuners has to be connected to a single source of RF signals, which is usually a (coaxial) cable with a specific characteristic impedance of e.g. 75 Ω. To obtain optimum RF signal transfer and to prevent RF signal reflections in the cable a splitter is used with an input impedance that substantially matches with the 75 Ω characteristic impedance of the RF source. The splitter has at least two outputs each with 75 Ω output impedance for reflection-free connection of two tuners with 75 Ω input impedance. If a third tuner has to be connected to the RF source, a second splitter is used with its input connected to the second output of the first splitter and with the second and third tuners connected to the first and second output of the second splitter respectively. For each further tuner a further splitter has to be used.

A problem with the aforementioned multi-tuner apparatus is that every time the RF signal passes a splitter, the RF signal is degraded because each splitter has limited linearity and limited noise performance. Furthermore the total power dissipation of all the splitters is significant and linearly increasing with the number of tuners.

It is an object of the present invention to overcome disadvantages of prior art multi-tuner receivers. Therefore, in the apparatus according to the invention the splitter has a splitter output with a splitter output impedance, while a plurality of tuners, each with an input impedance that is substantially higher than the splitter output impedance, is connected to the splitter output. Advantageous embodiments are defined in the dependent claims.

The basic idea behind the invention is that in a multi-tuner apparatus the distances between the splitter and the tuners are short enough so that RF signal reflections in the connections between the splitter and the tuners do not harm the signal quality. Consequently, power matching between these elements is not required. By designing relatively low impedance splitter outputs and relatively high impedance tuner inputs a single splitter can drive a plurality of tuners, so that a cascade of active splitters with its inherent larger non-linear distortion and its lower S/N ratio is avoided. Moreover, the relatively high impedance tuner inputs can be driven with low currents with the result that also the DC currents in the splitter and therewith the dissipation can be kept substantially lower than the dissipation in the plurality of splitters in prior art multi-tuner apparatus.

In practice the impedance of said splitter output (10 Ω) is substantially lower than the impedance of the splitter input (75 Ω) and that the impedance of each of said tuner inputs (e.g. 10 kΩ) is substantially higher than the impedance of said splitter input.

In an apparatus according to the invention a prior art tuner with an input impedance of e.g. 75 Ω may be used. To obtain sufficiently high input impedance a buffer stage may then be placed in front of the prior art tuner. To limit the number of buffer stages one buffer stage may drive two or more prior art tuners.

The present invention also provides a dual mode module for use in a multi-tuner apparatus. Such dual mode module has first and second modes of operation, an RF input impedance in the second mode of operation that is substantially higher than the RF input impedance in the first mode of operation and, in the first mode of operation, an RF output impedance that is substantially lower than the RF input impedance in the second mode of operation. Such dual mode module may e.g. comprise an RF splitter having a splitter input and at least first and second splitter outputs, said RF splitter being operative in the first mode of operation of the module and an RF signal path, operative in the second mode of operation of the module, having an input for connection to the first splitter output of a dual mode module in its first mode of operation and an output for outputting the RF signal to a tuner. Such dual mode module may be operated in one mode by connecting a pin of the module to ground or to a supply voltage and in the other mode by leaving the pin unconnected. Preferably, but not necessarily, each module may comprise its own tuner. The dual mode module allows a simple implementation of a multi-tuner apparatus in which for each tuner of the apparatus an identical module can to be used.

The invention will be further explained with reference to the accompanying Figures.

Figure 1:
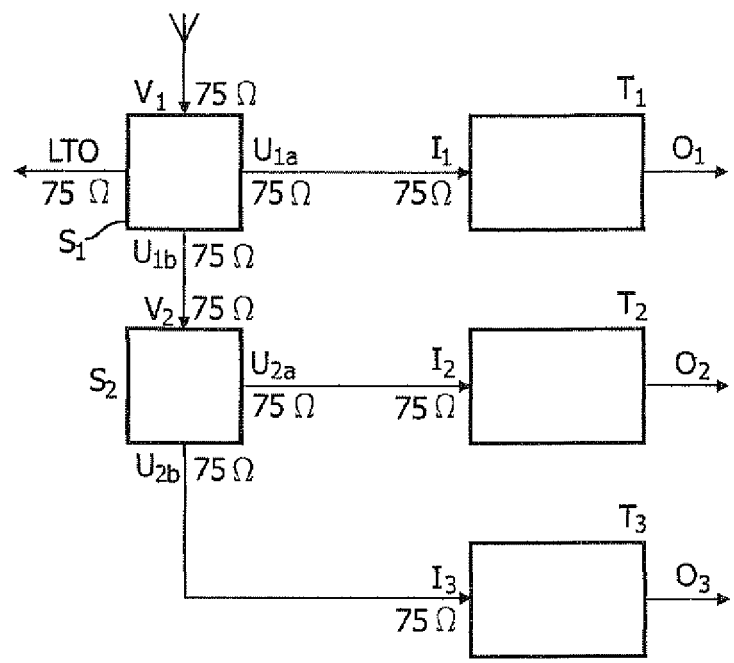
FIG. 1 shows a multi-tuner apparatus in accordance with the state of the art.

FIG. 1 shows three tuners $T_1$, $T_2$ and $T_3$, each having respective RF input terminals $I_1$, $I_2$ and $I_3$, and a respective IF output terminals $O_1$, $O_2$ and $O_3$. The Figure further shows two splitters $S_1$ and $S_2$. The splitter $S_1$ has a splitter input terminal $V_1$ for feeding an RF signal through a coaxial cable of 75 Ω characteristic impedance to the splitter $S_1$. The splitter $S_1$ has two output terminals $U_{1a}$ and $U_{1b}$. The splitter output $U_{1a}$ is connected to the tuner input $I_1$, and the splitter output $U_{1b}$ is connected to an input $V_2$ of the second splitter $S_2$. This splitter $S_2$ has an output $U_{2a}$ that is connected to the input $I_2$ of the tuner $T_2$, and an output $U_{2b}$ that is connected to the input $I_3$ of the tuner $T_3$. If a fourth tuner is required the splitter output $U_{2b}$ is connected to the input of a third splitter, and the outputs of this third splitter are connected to the inputs of the third and fourth tuners respectively. Additionally the splitter $S_1$ has a "loop through" output LTO for supplying an RF signal to another apparatus outside the present one via an external coaxial cable. For instance, when the apparatus of FIG. 1 is a multi-tuner television receiver, the LTO connection may be used to feed RF signal from the television receiver to a VCR.

In the Figure it is indicated that the splitter inputs $V_1$ and $V_2$, the splitter outputs $U_{1a}$, $U_{1b}$, $U_{2a}$, $U_{2b}$, LTO and the tuner-inputs $I_1$, $I_2$ and $I_3$ all have an impedance of 75 Ω, i.e. the characteristic impedance of the antenna cable. This implies that all the connections are reflection-free and provide maximum transfer of the available signal power. The splitters are usually active so that the loss of signal power that is inherent to the splitting can be compensated by appropriate amplification. However, because the splitters are active, the non-linear distortion of the RF signal and therewith the intermodulation between the channels of the RF signal increases with every splitter of the cascade of splitters. Moreover, the signal to noise ratio of the signal decreases the more splitters are passed.

Figure 2:
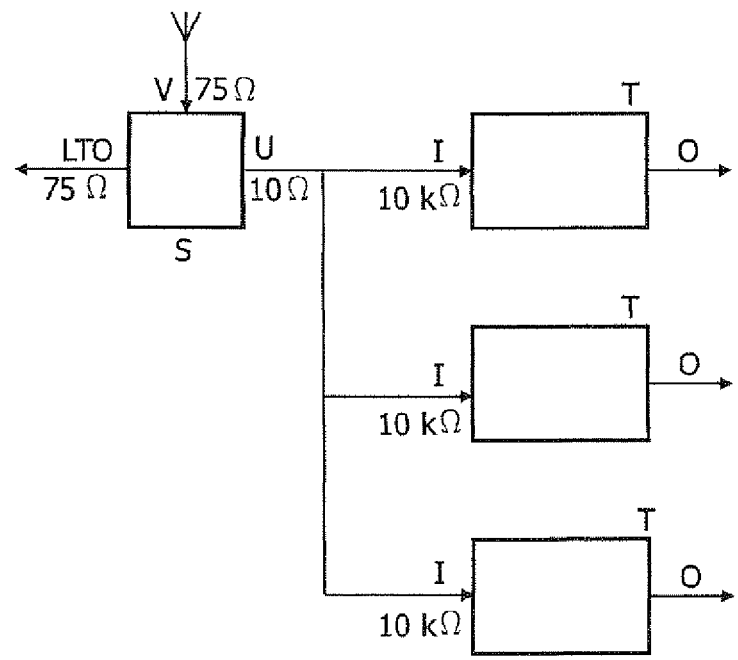
FIG. 2 shows a multi-tuner apparatus in accordance with the present invention.

The multi-tuner apparatus shown in FIG. 2 comprises a single active splitter S with a 75 Ω input V for connection to the RF signal source. In contradistinction with the arrangement of FIG. 1, the single splitter S has a low impedance output U of e.g. 10 Ω, and three tuners T each have a high impedance input of e.g. 10 kΩ. The low impedance splitter output feeds the high impedance inputs I of the three tuners T in parallel. If more tuners are required in this apparatus, they can easily be connected to the splitter output U without the necessity to add extra splitters. Because the maximum length of the connections between the splitter output U and the tuner inputs I is only in the order of some centimeters, the strong impedance mismatch reflections between the splitter output and the tuner inputs do not harm.

The high impedance of the tuner inputs I is easily obtained by a buffer stage, preferably in the form of an emitter-follower or source-follower transistor in the input of the tuner. Not only with respect to S/N-ratio and non-linear distortion, but also with respect to power dissipation, the arrangement of FIG. 2 is more advantageous than the arrangement of FIG. 1 because the power dissipation of the buffer stages of FIG. 2 can be far less than the power dissipation of the extra splitters of FIG. 1.

Figure 3:
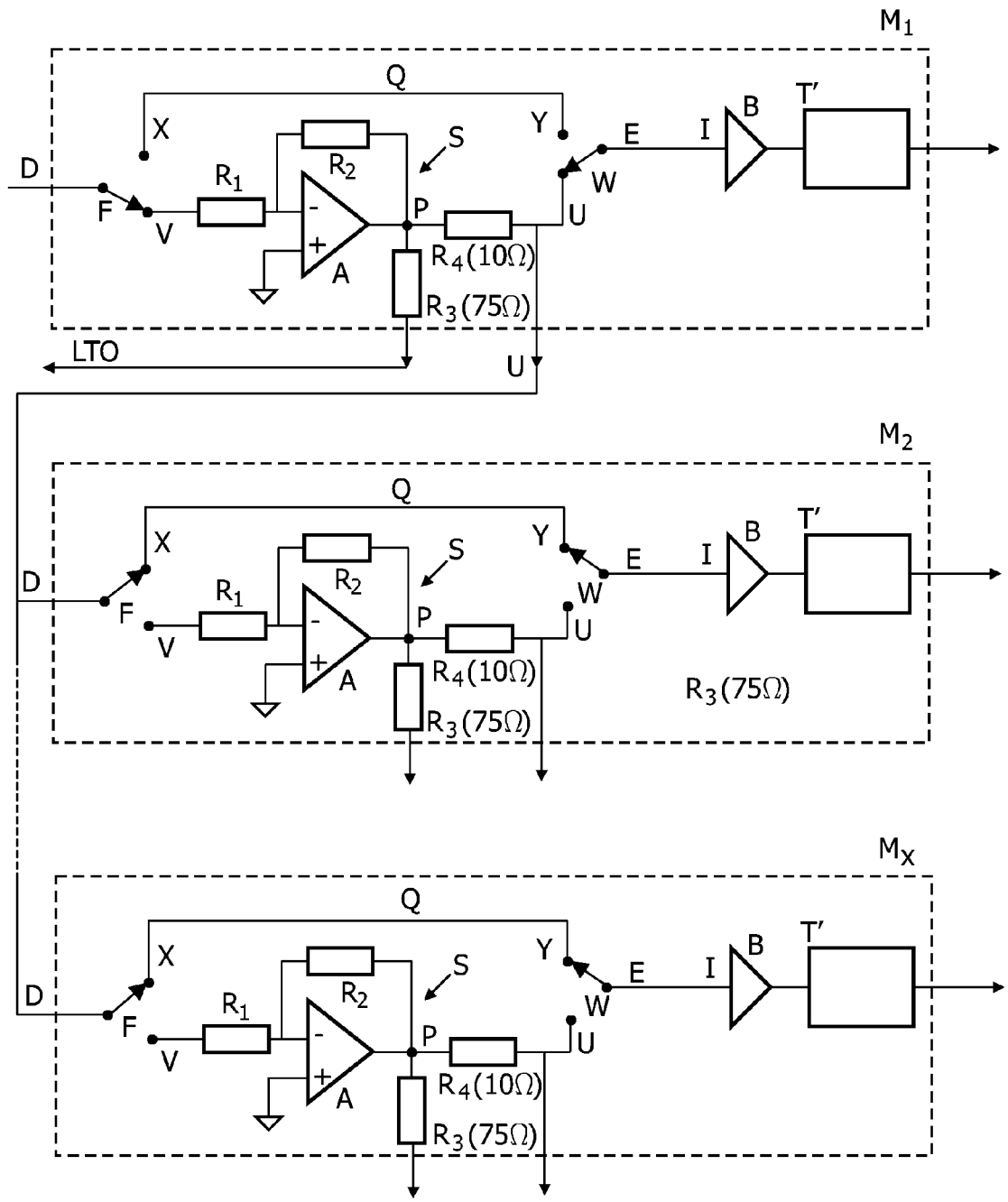
FIG. 3 shows a first set of dual mode modules for use in the multi-tuner apparatus of FIG. 2.

FIG. 3 shows a set of identical dual mode integrated modules $M_1$, $M_2$ ... $M_x$ for preferred use in the multi-tuner apparatus of FIG. 2. Each module has two mode switches F and W. The position of these switches determines the mode in which the module operates. The module $M_1$ has its two switches in the lower position and operates in the first mode; the modules $M_2$ ... $M_x$ have their switches in the upper position so that they operate in the second mode. The elements of FIG. 3 that correspond with the elements depicted in FIG. 2, have got the same reference numerals.

The module $M_1$ has an input terminal D to which an RF signal may be applied e.g. from an antenna cable. The RF signal is applied through the switch F to the input V of the splitter S. The splitter comprises an operational amplifier A with a resistor $R_1$ between the splitter input V and the − input of the operational amplifier whose + input is grounded. A feedback resistor $R_2$ is connected between the output P of the amplifier and its − input. The output P is further connected through a resistor $R_3$ to the LTO output terminal and through a resistor $R_4$ to the U output of the module. The resistor $R_1$ determines the input impedance of the splitter input V. With a value of 75 Ω for this resistor it is ascertained that the RF cable that is connected to this input D, is properly terminated with its characteristic impedance. The resistor $R_2$, which together with the resistor $R_1$ determines the amplification of the splitter, may e.g. have the value of 150 Ω, so that the amplification factor for the RF signals is about 2. The resistor $R_3$ is 75 Ω, thereby giving the cable connected to the LTO output, its correct source impedance. Finally, the resistor R4 is about 10 Ω, thereby giving the splitter output U the required output impedance of 10 Ω.

The module $M_1$ further comprises a buffer stage B and a tuning stage T'. These two stages together constitute the high input impedance tuner T as explained above with reference to FIG. 2. The input terminal I of the buffer stage B of module $M_1$ is connected to a common output E of the switch W, and through the switch W to the splitter output U. This splitter output U is connected externally to common inputs D of the modules $M_2$ ... $M_x$. These modules $M_2$ ... $M_x$ are in the second mode because their switches F and W are in the upper position. In this position the common input D is connected to a terminal X of a signal path Q whose output Y is connected through the switch W and its common output E to the input I of the buffer stage B. In this way the inputs I of the buffer stages B are all connected to the splitter output U of module $M_1$.

It is noticed that in the second mode of operation the splitter of the module $M_1$ is not active. Therefore, to reduce dissipation, the splitter amplifier A may be disconnected from the power supply in the second mode by a further switch (not shown in the FIG.).

The 10 Ω resistor $R_4$ serves to isolate the output P of the amplifier A from the parasitic capacitances of the splitter output U, the connection leads to the buffer inputs I and of the inputs of the buffer stages themselves. Without the resistor $R_4$ these capacitances would cause the amplifier A to become instable. However, because the connection from the splitter output U to the tuner input I of the module $M_1$ is much shorter than the connection to the buffer inputs of the modules $M_2$ ... $M_x$, the tuner-input I of the module $M_1$ can be directly connected to the output P of the amplifier. Furthermore, because the impedance at this point is still substantially lower (e.g. 2 Ω) than at the output U the input impedance of the tuning stage T' is per se high enough and the buffer B in module $M_1$ can be dispensed with in the first mode.

Figure 4:
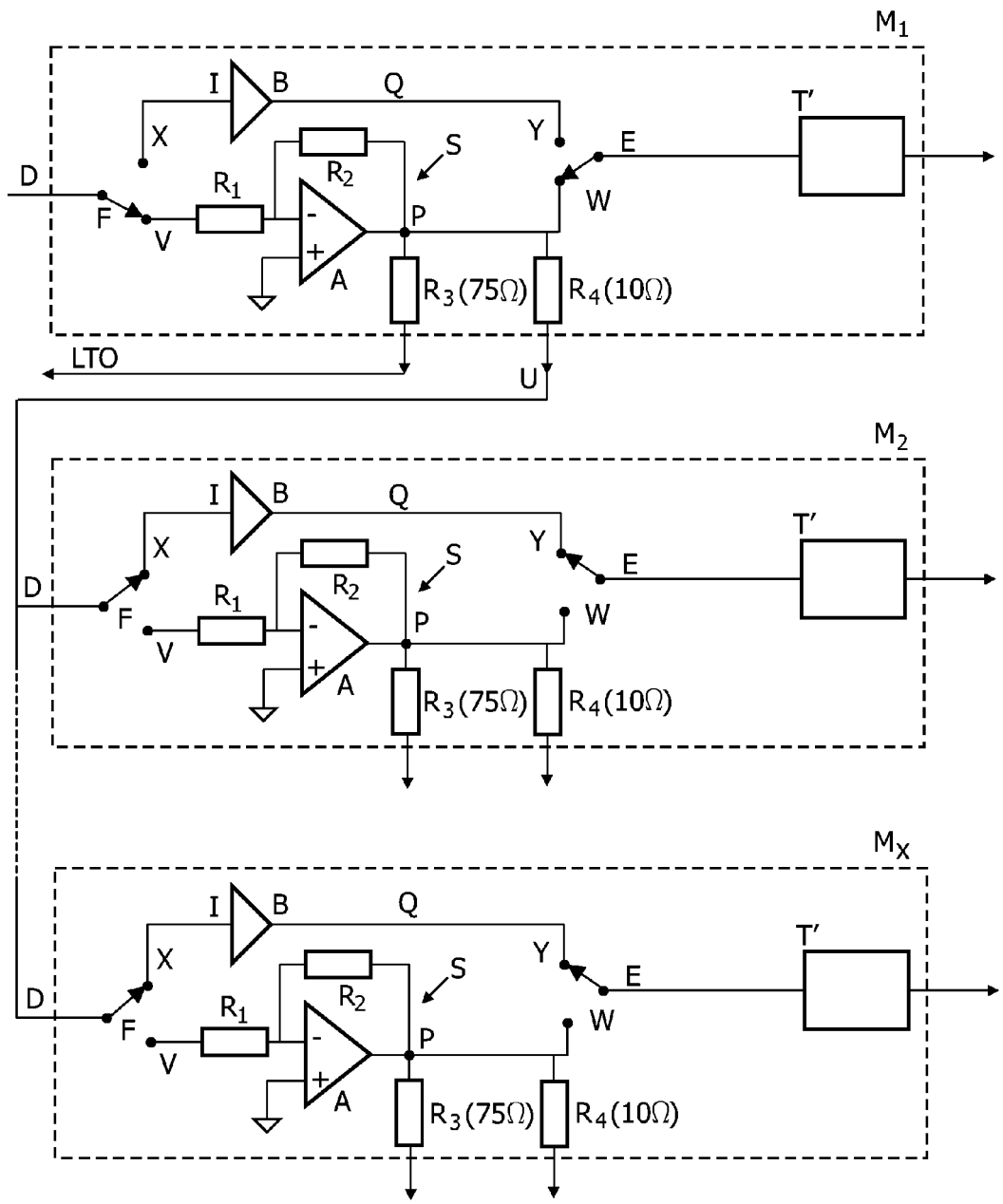
FIG. 4 shows a second set of dual mode modules for use in the multi-tuner apparatus of FIG. 2.

FIG. 4, in which corresponding elements with those of FIG. 3 have the same reference numerals, illustrates this modification. Again the depicted modules are identical, except of course with respect to the position of the switches F and W because the module $M_1$ operates in the first mode and the other modules operate in the second mode. In FIG. 4 the buffer B is placed between the input X and the output Y of the RF signal path Q. It is noticed that in the first operational mode of the module the splitter S is operative and the buffer B is inoperative while in the second operational mode of the module the splitter S is inoperative and the buffer B is operative. So the dissipation in the modules of FIG. 4 is more uniform than in the modules of FIG. 3.

Figure 5:
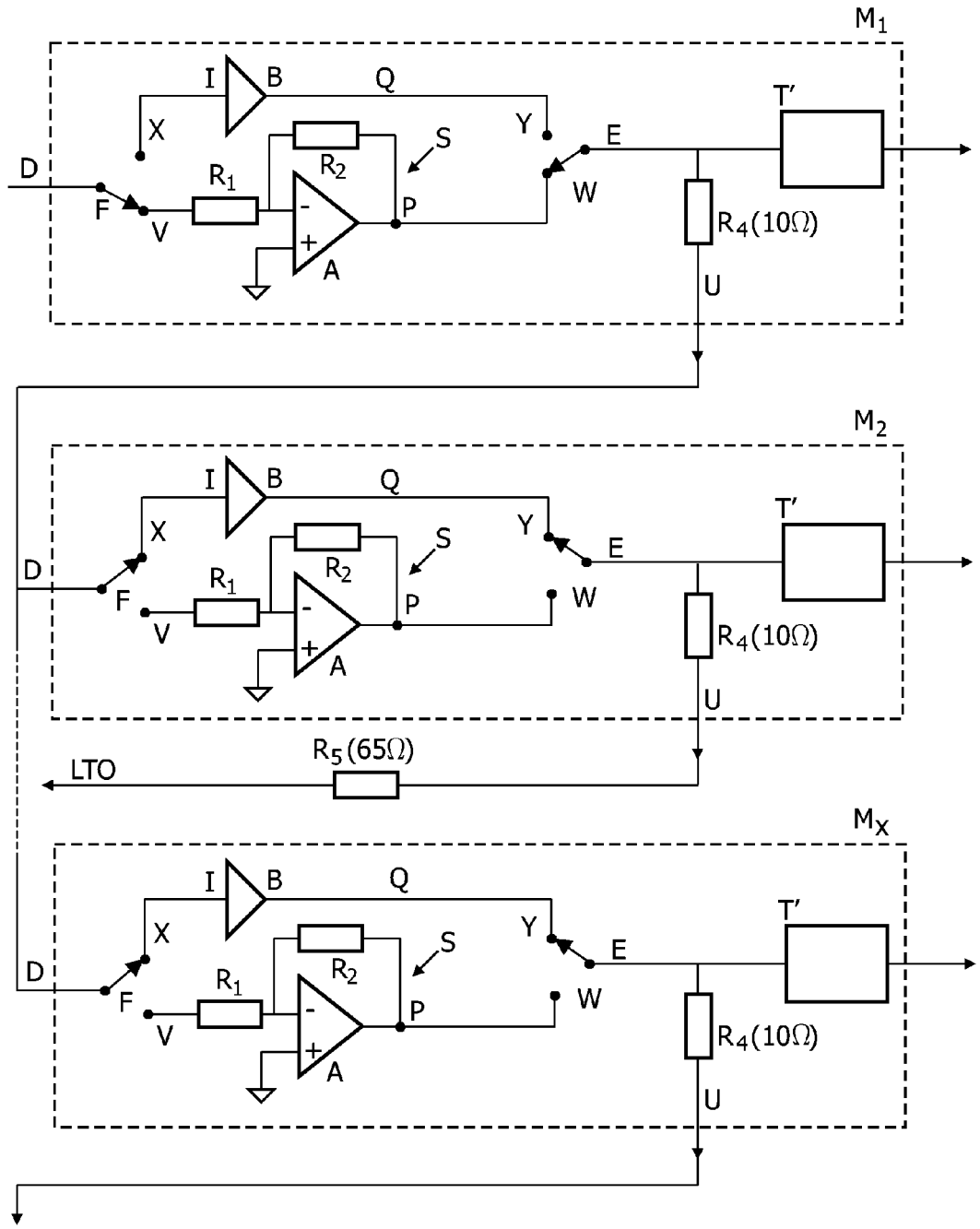
FIG. 5 shows a third set of dual mode modules for use in the multi-tuner apparatus of FIG. 2.

In the dual mode module of FIG. 5 the switch W is placed between the output P of the amplifier A and the output U of the module. In this implementation the switch W is in fact part of the splitter S with input V and output terminals U and E. Again the low impedance (10 Ω) output U of the module $M_1$ in the first mode drives the high impedance inputs D of the further modules $M_2$ ... $M_x$ in the second mode. However, now the low impedance output U of any further module in the second mode is also active because the buffer B of this second mode module now drives this output U. This has the advantage that the output U of one of the further modules can be used as LTO output through an external resistor $R_5$ of 65. Then a special LTO output of each module can be spared. Also, because the number of second mode modules that can be connected to the U output of the first-mode module $M_1$ is limited because of the parasitic capacitances of these external connections, a U output of one of the second-mode modules ($M_x$) can now be used to drive the D inputs of further second-mode modules.

It may be noticed that the tuning stage T' in FIGS. 3, 4 and 5 are not necessarily elements of the dual mode modules. If desired the dual mode module may be used with external tuners only. Also the switch F in FIGS. 3, 4, 5, and the switch W in FIGS. 3, 4 (if there is no tuner in the module) are not essential elements of the dual mode module. Because the mode in which the module operates is fixed at its installation in the multi-tuner apparatus and remains unchanged, the switches can be deleted when their input and output terminals V, U, X, and Y are provided as externally accessible pins of the module.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention may be implemented by means of hardware comprising several distinct elements, and/or by means of a suitably programmed processor. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A multi-tuner apparatus comprising:
    an active splitter having a splitter input, having a splitter input impedance, that is configured for connection to a Radio Frequency (RF) signal source, and a single splitter output having a splitter output impedance; and
    a plurality of tuners connected to said first splitter output, wherein a ratio of input impedance of each of the plurality of tuners to the splitter output impedance is substantially one thousand.

2. The multi-tuner apparatus as claimed in claim 1, wherein the splitter output impedance is substantially lower than the splitter input impedance, and the input impedance of each of said tuners is substantially higher than the splitter input impedance.

3. The multi-tuner apparatus of claim 1, wherein the plurality of tuners are connected to the single splitter output.

4. The multi-tuner apparatus of claim 1, wherein a maximum length of a connection between the single splitter output and the plurality of tuners is a few centimeters.

5. The multi-tuner apparatus of claim 1, wherein each of the plurality of tuners has a buffer stage.

6. The multi-tuner apparatus of claim 5, wherein the buffer stage comprises an emitter-follower transistor at an input of each tuner.

7. The multi-tuner apparatus of claim 5, wherein the buffer stage comprises an source-follower transistor at an input of each tuner.

8. A dual mode module having first and second modes of operation, the dual mode module comprising:
    an input terminal that receives a Radio Frequency (RF) signal, wherein an RF input impedance in the second mode of operation is substantially higher than the RF input impedance in the first mode of operation, and a ratio of an RF output impedance in the first mode of operation to the RF input impedance in the second mode of operation is substantially one thousand.

9. The dual mode module as claimed in claim 8, further comprising:
    an RF splitter having a splitter input and a splitter output, said RF splitter being operative in the first mode of operation of the dual mode module; and
    an RF signal path, operative in the second mode of operation, having an input for connection to the first splitter output in the first mode of operation, and an output for outputting an RF signal to a tuner.

10. The dual mode module as claimed in claim 9, further comprising:
    a mode output switch arranged to connect the splitter output to a common output in the first mode of operation and to connect the output of said RF signal path to said common output in the second mode of operation.

11. The dual mode module as claimed in claim 10, further comprising:
    a tuner with its tuner input connected to said common output.

12. The dual mode module as claimed in claim 9, further comprising:
    a mode input switch arranged to connect the first splitter input to a common input in the first mode of operation and to connect the input of said RF signal path to said common input in the second mode of operation.

13. The dual mode module as claimed in claim 9, further comprising:
    a buffer stage connected in said RF signal path.

14. The dual mode module of claim 9, wherein the RF splitter further comprises an operational amplifier, and a resistor coupled between the splitter input and a negative input of the operational amplifier determines the RF input impedance.

15. The dual mode module of claim 14, wherein a low impedance resistor isolates an output of the operational amplifier from parasitic capacitance of the splitter output.

16. A multi-tuner apparatus comprising:
    an active splitter having a splitter input for connection to a Radio Frequency (RF) signal source, and a splitter output having a splitter output impedance; and
    a plurality of tuners connected to said splitter output, each tuner having an input impedance that is substantially higher than the splitter output impedance, wherein a ratio of the input impedance of each tuner to the splitter output impedance is substantially one thousand.

* * * * *